United States Patent
Takahashi et al.

(10) Patent No.: US 11,543,719 B2
(45) Date of Patent: Jan. 3, 2023

(54) LIGHT CONTROL UNIT

(71) Applicant: TOPPAN PRINTING CO., LTD., Tokyo (JP)

(72) Inventors: Masayuki Takahashi, Taito-ku (JP); Kazuki Takahashi, Taito-ku (JP); Yasunori Hashida, Taito-ku (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/063,074

(22) Filed: Oct. 5, 2020

(65) Prior Publication Data

US 2021/0018809 A1    Jan. 21, 2021

Related U.S. Application Data

(63) Continuation of application No. PCT/JP2019/014972, filed on Apr. 4, 2019.

(30) Foreign Application Priority Data

Apr. 5, 2018    (JP) .............................. JP2018-073242

(51) Int. Cl.
    *G02F 1/1362*    (2006.01)
    *G02F 1/139*    (2006.01)
(52) U.S. Cl.
    CPC ........ *G02F 1/136286* (2013.01); *G02F 1/139* (2013.01)
(58) Field of Classification Search
    CPC ................. G02F 1/136286; G02F 1/13; G02F 2201/503; G02F 2202/28; G02F 1/133311;
    (Continued)

(56) References Cited

U.S. PATENT DOCUMENTS 5,180,888 A * 1/1993 Sugiyama ............. G02F 1/1345
                                                            174/84 R
5,679,928 A * 10/1997 Okano ..................... H01R 4/04
                                                            174/261
(Continued)

FOREIGN PATENT DOCUMENTS

EP    1 630 592 A1    3/2006
JP    2-79818 A    3/1990
(Continued)

OTHER PUBLICATIONS

International Search Report dated Jun. 25, 2019 in PCT/JP2019/014972, filed Apr. 4, 2019 (with English Translation).
(Continued)

*Primary Examiner* — Mariam Qureshi
(74) *Attorney, Agent, or Firm* — Oblon, McClelland, Maier & Neustadt, L.L.P.

(57) ABSTRACT

A light control unit including a light control sheet including a first transparent electrode layer, a second transparent electrode layer, and a light control layer formed between the first and second transparent electrode layers and including a liquid crystal composition, and at least one first connection member that connects the first transparent electrode layer and a power supply. The light control sheet includes a light control region where the light control layer is located and at least one first region contiguous to the light control region in a plan view of the light control sheet. The first connection member includes a first wiring member connected to a first conductive adhesive layer formed on the light control sheet in the first region. The first wiring member includes a wiring layer that has a conductive patterned end portion where the wiring layer makes contact with the first conductive adhesive layer.

20 Claims, 7 Drawing Sheets

(58) Field of Classification Search
CPC ........... G02F 1/13452; G02F 1/133607; G02F 1/133606; G02F 1/133602–1/133614; G02F 1/133388; H01L 24/32; E06B 9/24; E06B 2009/2464; H01R 4/04; H01B 9/02; H01B 7/24; G02B 6/005; G02B 6/0033–0063
See application file for complete search history.

(56) References Cited

U.S. PATENT DOCUMENTS

| | | |
|---|---|---|
| 9,607,960 B1 | 3/2017 | Peng et al. |
| 2002/0135727 A1* | 9/2002 | Nakaminami ...... G02F 1/13452 349/149 |
| 2007/0013856 A1* | 1/2007 | Watanabe ............. H01R 12/62 349/150 |

FOREIGN PATENT DOCUMENTS

| | | |
|---|---|---|
| JP | 3-184077 A | 8/1991 |
| JP | 6-289410 A | 10/1994 |
| JP | 2000-250060 A | 9/2000 |
| JP | 2006-162823 A | 6/2006 |
| JP | 2014-500972 A | 1/2014 |
| JP | 2016-143768 A | 8/2016 |
| JP | 2017-181558 A | 10/2017 |
| JP | 2018-36293 A | 3/2018 |

OTHER PUBLICATIONS

Extended European Search Report dated Apr. 30, 2021 in European Patent Application No. 19782459.2, 8 pages.
Japanese Office Action dated Jun. 14, 2022 in Japanese Patent Application No. 2021-143448 (with unedited computer generated English Translation), 9 pages.

* cited by examiner

LIGHT CONTROL UNIT

CROSS-REFERENCE TO RELATED APPLICATIONS

The present application is a continuation of International Application No. PCT/JP2019/014972, filed Apr. 4, 2019, which is based upon and claims the benefits of priority to Japanese Application No. 2018-073242, filed Apr. 5, 2018. The entire contents of all of the above applications are incorporated herein by reference.

BACKGROUND OF THE INVENTION

Field of the Invention

The present invention relates to a light control unit that includes a light control sheet and a connection member for connecting the light control sheet to a power supply.

Discussion of the Background

A light control sheet includes a light control layer containing a liquid crystal composition and a pair of transparent electrode layers sandwiching the light control layer. Applying a driving voltage across the pair of transparent electrode layers changes alignment of the liquid crystal molecules in the light control layer, thereby changing the light transmittance of the light control sheet (see, for example, JP 2006-162823 A). Such a light control sheet and a connection member for connecting the transparent electrode layers to a power supply constitute a light control unit.

An example configuration of a light control unit will be described below with reference to drawings. As shown in FIG. 11, a light control unit 100 is attached to a transparent plate 200 such as a window pane. The light control sheet 110 includes a pair of electrode sheets 130A and 130B. A connection member 160A is connected to the electrode sheet 130A, while a connection member 160B is connected to the electrode sheet 130B. In more detail, the electrode sheet 130A is a laminate consisting of a transparent electrode layer 140A and a transparent support layer 150A, as shown in FIG. 12. The transparent electrode layer 140A is in contact with one side of the light control layer 120. The transparent support layer 150A is attached to the transparent plate 200 via an adhesive layer 210. The connection member 160A is connected to a region of the transparent electrode layer 140A not covered by the light control layer 120 and the electrode sheet 130B. As shown in FIG. 13, the electrode sheet 130B is a laminate formed of a transparent electrode layer 140B and a transparent support layer 150B. The transparent electrode layer 140B is in contact with the other side of the light control layer 120. The connection member 160B is connected to a region of the transparent electrode layer 140B not covered by the light control layer 120 and the electrode sheet 130A, and faces the transparent plate 200.

The connection members 160A and 160B each include a conductive adhesive layer 161 joined to the respective transparent electrode layers 140A and 140B, and a conductive tape 162 joined to the conductive adhesive layer 161. The conductive adhesive layer 161 is formed of a conductive paste such as a silver paste. The conductive tape 162 is, for example, a copper tape. The connection members 160A and 160B further include a solder ball 163, which is disposed on a surface of the conductive tape 162, and a lead wire 164 connected to the conductive tape 162 with the solder ball 163. The lead wire 164 is connected to a driver circuit that converts a voltage supplied from the power supply into a driving voltage. The driving voltage is applied across the transparent electrode layers 140A and 140B through the connection members 160A and 160B.

SUMMARY OF THE INVENTION

According to an aspect of the present invention, a light control unit includes a light control sheet including a first transparent electrode layer, a second transparent electrode layer, and a light control layer formed between the first and second transparent electrode layers and comprising a liquid crystal composition, and at least one first connection member that connects the first transparent electrode layer and a power supply. The light control sheet includes a light control region where the light control layer is located and at least one first region contiguous to the light control region in a plan view of the light control sheet. The first connection member includes a first wiring member connected to a first conductive adhesive layer formed on the light control sheet in the first region. The first wiring member includes a wiring layer and an insulating resin layer supporting the wiring layer. The wiring layer has a conductive patterned end portion where the wiring layer makes contact with the first conductive adhesive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
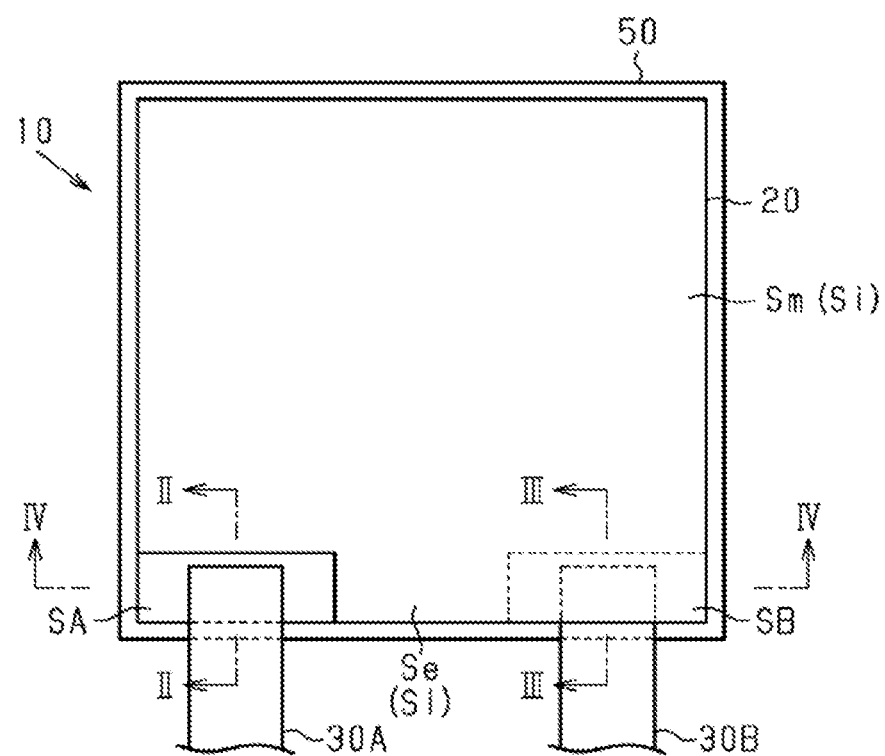
FIG. 1 shows a planar structure of a light control unit according to an embodiment thereof.

The embodiments will now be described with reference to the accompanying drawings, wherein like reference numerals designate corresponding or identical elements throughout the various drawings.

An embodiment of a light control unit will be described with reference to FIGS. 1 to 7.

(Configuration of a Light Control Unit)

As shown in FIG. 1, a light control unit 10 includes a light control sheet 20, and a first connection member 30A and a second connection member 30B. The light control unit 10 is attached to a transparent plate 50 for use. The transparent plate 50 is a transparent plate member made of glass, resin, or the like. The transparent plate 50 may be, for example, a building material such as a window pane, a partition, and a glass wall, or a vehicle member such as a window pane of an automobile.

In plan view of the light control sheet 20, the light control sheet 20 is substantially rectangular and includes a light control region Si, and a first wiring region SA and a second wiring region SB. A first connection member 30A is connected to the first wiring region SA, while a second connection region 30B is connected to the second wiring region SB. These two wiring regions SA and SB are each located at an end of the light control sheet 20 and aligned along one side of the sheet 20. The wiring regions SA and SB may be disposed on any side according to how the transparent plate 50, the driver circuit, etc. are arranged.

The first wiring region SA and the second wiring region SB are disposed, for example, in part of the light control sheet 20 including a corner thereof. In other words, the first wiring region SA extends from a corner of the light control sheet 20 including one end of the above-mentioned side, while the second wiring region SB extends from a corner of the light control sheet 20 including the other end of the above-mentioned side.

An inter-terminal region Se, which is a part of the light control region Si, is located between the first wiring region SA and the second wiring region SB. In other words, in plan view of the light control sheet 20, the first wiring region SA, the inter-terminal region Se, and the second wiring region SB are disposed in this order along the above-mentioned side of the light control sheet 20, with the inter-terminal region Se located between the first connection member 30A and the second connection member 30B.

In the light control region Si, the region other than the inter-terminal region Se is a main region Sm. The inter-terminal region Se and the main region Sm have an identical layer structure, the former protruding from the main region Sm to a space between the first connection member 30A and the second connection member 30B.

In plan view of the light control sheet 20, the first connection member 30A extends from the first wiring region SA toward the outside of the light control sheet 20, while the second connection member 30B extends from the second wiring region SB toward the outside of the light control sheet 20. The first connection member 30A and the second connection member 30B are separate from each other outside the light control sheet 20 and are separately connected to the driver circuit.

Figure 2:
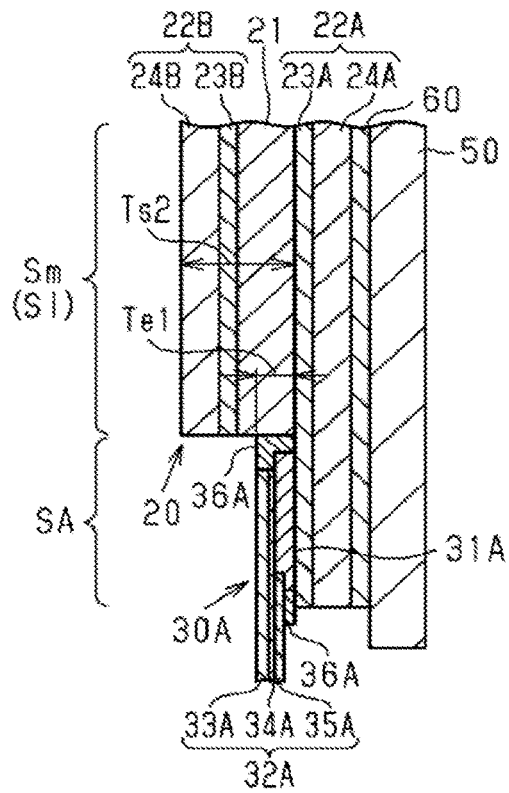
FIG. 2 shows a cross-sectional structure taken along the line II-II in FIG. 1.
Figure 3:
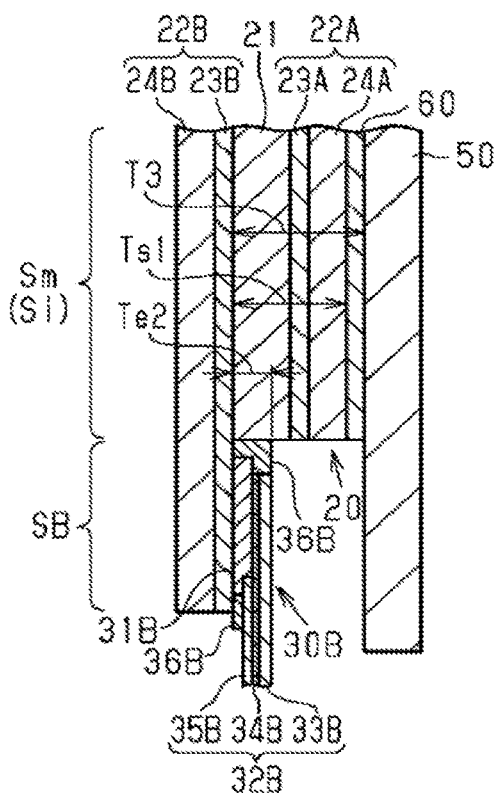
FIG. 3 shows a cross-sectional structure taken along the line III-III in FIG. 1.

FIG. 2 is a cross-sectional view taken along the line II-II in FIG. 1. FIG. 3 is a cross-sectional view taken along the line III-III in FIG. 1. As shown in FIGS. 2 and 3, the light control sheet 20 has a light control layer 21, a first electrode sheet 22A, and a second electrode sheet 22B. The first electrode sheet 22A consists of a first transparent electrode layer 23A and a first transparent support layer 24A, which supports the first transparent electrode layer 23A. A surface of the first transparent support layer 24A facing away from a surface in contact with the first transparent electrode layer 23A is attached to a transparent plate 50 via an adhesive layer 60. The second electrode sheet 22B consists of a second transparent electrode layer 23B and a second transparent support layer 24B, which supports the second transparent electrode layer 23B.

In the light control region Si, the light control layer 21 is sandwiched between the first electrode sheet 22A and the second electrode sheet 22B. In more detail, the light control layer 21 is located between the first transparent electrode layer 23A and the second transparent electrode layer 23B facing each other. The light control region Si is thus a region where the light control layer 21 is located.

The light control layer 21 contains a liquid crystal composition. The light control layer 21 is composed of, for example, a polymer network liquid crystal (PNLC), a polymer dispersed liquid crystal (PDLC), a nematic curvilinear aligned phase (NCAP) liquid crustal, or the like. For example, a polymer network liquid crystal has a three-dimensional mesh polymer network, and holds liquid crystal molecules in voids in the polymer network. The liquid crystal molecules contained in the light control layer 21 have, for example, positive dielectric anisotropy, and have a higher dielectric constant in a major axis direction than in a minor axis direction of the liquid crystal molecules. The liquid crystal molecules are, for example, liquid crystal molecules based on a Schiff base, azo, azoxy, biphenyl, terphenyl, benzoic acid ester, tolan, pyrimidine, cyclohexanecarboxylic acid ester, phenylcyclohexane, or di oxane molecules.

Each of the first transparent conductive layer 23A and the second transparent conductive layer 23B is a conductive transparent layer. The transparent electrode layer 23A and 23B may be composed of, for example, indium tin oxide (ITO), fluorine doped tin oxide (FTO), tin oxide, zinc oxide, carbon nanotubes (CNT), or a polymer such as poly(3,4-ethylenedioxythiophene) (PEDOT).

Each of the first transparent support layer 24A and the second transparent support layer 24B is a transparent substrate. The transparent support layers 24A and 24B may be, for example, a glass substrate, a silicon substrate, or a polymer film made of polyethylene, polystyrene, polyethylene terephthalate, polyvinyl alcohol, polycarbonate, polyvinyl chloride, polyimide, polysulfone, cyclo-olefin polymer, triacetyl cellulose, or the like.

The adhesive layer 60 is transparent, and may be composed of an adhesive that does or does not need solidification when joined to an object. The adhesive layer 60 is composed of, for example, an adhesive made of an acrylic resin, an epoxy resin, or the like.

When no driving voltage is applied across the transparent electrode layers 23A and 23B, the major axes of the liquid crystal molecules are irregularly oriented. Accordingly, light incident on the light control layer 21 is scattered and the light control region Si appears whitish. Thus, when no driving voltage is applied to the light control layer 21, the light control region Si is opaque. On the other hand, when a driving voltage is applied across the first transparent electrode layer 23A and the second transparent electrode layer 23B through the connection members 30A and 30B, the liquid crystal molecules are aligned, and the major axes of the liquid crystal molecules are oriented in the direction of an electric field between the transparent electrode layers 23A and 23B. As a result, light is more likely to be transmitted through the light control layer 21 and the light control region Si becomes transparent.

As shown in FIG. 2, in the first wiring region SA, the first electrode sheet 22A is present, while the light control layer 21 and the second electrode sheet 22B are not present. In the first wiring region SA, the first transparent electrode layer 23A has a surface exposed from another layer of the light control sheet 20. The first connection member 30A is connected to this surface of the first transparent electrode layer 23A.

In more detail, the first electrode sheet 22A continuously extends from the main region Sm of the light control region Si to the first wiring region SA. In other words, the first electrode sheet 22A includes a region corresponding to the light control region Si and a region contiguous to this region and corresponding to the first wiring region SA.

The light control layer 21 and the second electrode sheet 22B are located only in the main region Sm. At an edge of the main region Sm contiguous to the first wiring region SA, end faces of the light control layer 21, the second transparent electrode layer 23B, and the second transparent support layer 24B are aligned along a thickness direction of the light control sheet 20.

In other words, the first wiring region SA is a region of the light control sheet 20 from which the light control layer 21 and the second electrode sheet 22B are removed. The first connection member 30A is connected to the region of the first transparent electrode layer 23A which corresponds to the first wiring region SA.

The first connection member 30A includes a first conductive adhesive layer 31A; a first wiring member 32A which has a conductive patterned end; and a first sealing member 36A. The first conductive adhesive layer 31A is joined to a surface of the first transparent electrode layer 23A. The first wiring member 32A is joined to a surface of the first conductive adhesive layer 31A facing away from the surface in contact with the first transparent electrode layer 23A. In other words, the first wiring member 32A is fixed to the first transparent electrode layer 23A via the first conductive adhesive layer 31A. The first wiring member 32A is joined to the first conductive adhesive layer 31A at an end of the first wiring member 32A, and extends toward an outside of the light control 20 from this joint part.

The first conductive adhesive layer 31A may be, for example, an anisotropic conductive film (ACF), an anisotropic conductive paste (ACP), an isotropic conductive film (ICF), or an isotropic conductive paste (ICP). Using the anisotropic material among these allows a conductive path along a conductive pattern to be formed within the first conductive adhesive layer 31A, which helps to obtain electrical characteristics as designed. In addition, using the isotropic material among them allows a resistance value to be kept low all over the first conductive adhesive layer 31A. It is therefore appropriate to use an isotropic material especially if a large amount of current needs to be applied to the light control sheet 20 through the connection members 30A and 30B. In addition to these advantages, the anisotropic conductive film is preferable as the first conductive adhesive layer 31A from the viewpoint of ease of handling in manufacturing processes or the like.

The first wiring member 32A includes an insulating resin layer 33A, which is a flexible substrate composed of an insulating resin such as polyimide, a wiring layer 34A composed of a metal thin film of copper or the like, and a protective layer 35A composed of an insulating resin. More specifically, a flexible printed circuit (FPC) is used as the first wiring member 32A.

The wiring layer 34A is supported by the insulating resin layer 33A, and more specifically is attached to one of the two major surfaces of the insulating resin layer 33A via an adhesive layer (not shown). A protective layer 35A covers part of the wiring layer 34A on an opposite side of the wiring layer 34A from the insulating resin layer 33A. The wiring layer 34A has an end exposed from the protective layer 35A.

The first wiring member 32A is arranged so that the surface of the insulating resin layer 33A on which the wiring layer 34A is located faces the conductive adhesive layer 31A, and the part of the surface of the wiring layer 34A exposed from the protective layer 35A is joined to the first conductive adhesive layer 31A. The part of the wiring layer 34A covered by the protective layer 35A may also be partially joined to the first conductive adhesive layer 31A.

The first sealing member 36A is made of an insulating resin. The first sealing member 36A covers a periphery of a joint part between the first conductive adhesive layer 31A and the first wiring member 32A, and a periphery of a joint part between the first connection member 30A and the first transparent electrode layer 23A. More specifically, the first sealing member 36A includes a part that fills a gap between the first connection member 30A and the light control layer 21 in the light control region Si. The first sealing member 36A also includes a part that fills a gap between the first transparent electrode layer 23A and a part of the first wiring member 32A extending from the joint part with the first conductive adhesive layer 31A toward the outside of the light control sheet 20.

The first sealing member 36A protects a joint part between the first conductive adhesive layer 31A and the first wiring member 32A and a joint part between the first connection member 30A and the first transparent electrode layer 23A from dirt, etc., thereby preventing deterioration of joining the respective members to each other. In addition, the first sealing member 36A fills the gap between the first connection member 30A and the light control layer 21 in the light control region Si, thereby preventing the light control sheet 20 from being crushed at an edge of the light control region Si and causing a short circuit between the first transparent electrode layer 23A and the second transparent electrode layer 23B.

A total thickness Te1 of the first wiring member 32A and the first conductive adhesive layer 31A at the joint part between the first wiring member 32A and the first conductive adhesive layer 31A is less than a total thickness Ts2 of the light control layer 21 and the second electrode sheet 22B. In other words, a maximum thickness of a part of the first connection member 30A joined to the first wiring region SA is less than the thickness Ts2.

This prevents the first connection member 30A from protruding from the surface of the light control sheet 20, which in turn prevents the first connection member 30A from coming into contact with an object around the light control unit 10. This in turn prevents an external force from acting on the joint part between the first connection member 30A and the first transparent electrode layer 23A or the joint part between the first conductive adhesive layer 31A and the first wiring member 32A and weakening the joint.

As shown in FIG. 3, in the second wiring region SB, a second electrode sheet 22B is present, while the light control layer 21 and the first electrode sheet 22A are not present. In the second wiring region SB, the second transparent electrode layer 23B has a surface exposed from another layer of the light control sheet 20. This surface faces a surface of the transparent plate 50. The second connection member 30B is connected to the above-mentioned surface of the second transparent electrode layer 23B.

In more detail, the second electrode sheet 22B continuously extends from the main region Sm of the light control region Si to the second wiring region SB. In other words, the second electrode sheet 22B includes a region corresponding to the light control region Si and a region contiguous to this region and corresponding to the second wiring region SB.

The light control layer 21 and the second electrode sheet 22B are located only in the main region Sm. At an edge of the main region Sm contiguous to the second wiring region SB, end faces of the light control layer 21, the first transparent electrode layer 23A, and the first transparent support layer 24A are aligned along the thickness direction of the light control sheet 20.

In other words, the second wiring region SB is the region of the light control sheet 20 from which the light control layer 21 and the first electrode sheet 22A are removed. The second connection member 30B is connected to the region of the second transparent electrode layer 23B which corresponds to the second wiring region SB. The adhesive layer 60 may not be disposed in a part facing the second wiring region SB.

The second connection member 30B includes a second conductive adhesive layer 31B; a second wiring member 32B which has a conductive patterned end; and a second sealing member 36B. As the second conductive adhesive layer 31B for example, any of an anisotropic conductive film, an anisotropic conductive paste, an isotropic conductive film, or an isotropic conductive paste is used, as with the first conductive adhesive layer 31A. As with the first wiring member 32A, the second wiring member 32B is also composed of a flexible printed circuit board. The second wiring member 32B includes an insulating resin layer 33B, a wiring layer 34B composed of a metal thin film attached to one side of the insulating resin layer 33B, and a protective layer 35B partially covering the wiring layer 34B.

The second conductive adhesive layer 31B is joined to a surface of the second transparent electrode layer 23B. The second wiring member 32B is arranged such that the wiring layer 34B faces the second conductive adhesive layer 31B, and an end of the surface of the wiring layer 34B exposed from the protective layer 35B is joined to the second conductive adhesive layer 31B. The surface of the second wiring member 32B on a side opposite to that joined to the second conductive adhesive layer 31B faces the transparent plate 50. The second wiring member 32B is joined to the second conductive adhesive layer 31B at an end thereof, and extends toward the outside of the light control sheet 20 from this joint part.

The second sealing member 36B is made of an insulating resin. The second sealing member 36B includes a part that fills a gap between the second connection member 30B and the light control layer 21 in the light control region Si. The second sealing member 36B also includes a part that fills a gap between the second transparent electrode layer 23B and a part of the second wiring member 32B extending from the joint part with the second conductive adhesive layer 31B toward the outside of the light control sheet 20. This protects the joint part between the second conductive adhesive layer 31B and the second wiring member 32B or the joint part between the second connection member 30B and the second transparent electrode layer 23B, and additionally prevents the first transparent electrode layer 23A and the second transparent electrode layer 23B from coming into contact with each other at an edge of the light control region Si and causing a short circuit.

A total thickness Te2 of the second wiring member 32B and the second conductive adhesive layer 31B at the joint part between the second wiring member 32B and the second conductive adhesive layer 31B is less than a total thickness Ts1 of the light control layer 21 and the first electrode sheet 22A. In other words, the maximum thickness of the part of the second connection member 30B connected to the second wiring region SB is less than the thickness Ts1, and even less than a total thickness T3 of the light control layer 21, first electrode sheet 22A, and adhesive layer 60.

This prevents the second connection member 30B from coming into contact with the transparent plate 50, thereby preventing an external force from acting on the joint part between the second connection member 30B and the second transparent electrode layer 23B or the joint part between the second conductive adhesive layer 31B and the second wiring member 32B and weakening the joint. This also prevents the second wiring region SB from projecting from the surface of the light control sheet 20, which in turn prevents distortion such as folding in the second electrode sheet 22B.

Figure 4:
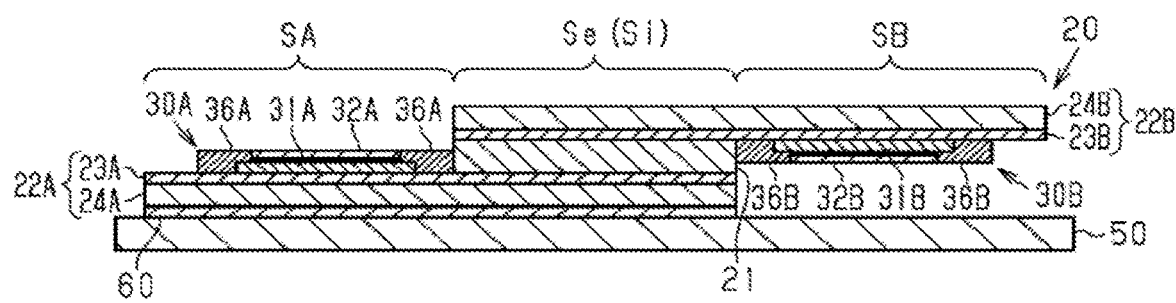
FIG. 4 shows a cross-sectional structure taken along the line IV-IV in FIG. 1.

FIG. 4 is a cross-sectional view taken along the line IV-IV of FIG. 1. As shown in FIG. 4, the light control sheet 20 includes the light control layer 21, the first electrode sheet 22A, and the second electrode sheet 22B in the inter-terminal region Se located between the first wiring region SA and the second wiring region SB. As described above, the light control sheet 20 in the inter-terminal region Se and the light control sheet 20 in the main region Sm have the same layer structure. Each of the light control layer 21, the first electrode sheet 22A, and the second electrode sheet 22B extends continuously from the main region Sm to the inter-terminal region Se. The first electrode sheet 22A extends continuously from the inter-terminal region Se to the first wiring region SA. The second electrode sheet 22B extends continuously from the inter-terminal region Se to the second wiring region SB.

At an edge of the inter-terminal region Se contiguous to the first wiring region SA, end faces of the light control layer 21, the second transparent electrode layer 23B, and the second transparent support layer 24B are aligned along the thickness direction of the light control sheet 20. At an edge of the inter-terminal region Se contiguous to the second wiring region SB, end faces of the light control layer 21, the first transparent electrode layer 23A, and the first transparent support layer 24A are aligned along the thickness direction of the light control sheet 20.

(Configuration of Pattern of Conductor)

The wiring layer 34A of the first wiring member 32A has a conductive patterned end, and is joined to the first conductive adhesive layer 31A at the end. Similarly, the wiring layer 34B of the second wiring member 32B has a conductive patterned end, and is joined to the second conductive adhesive layer 31B at the end. Such a conductive pattern is formed, for example, by etching a thin metal film.

Figure 5:
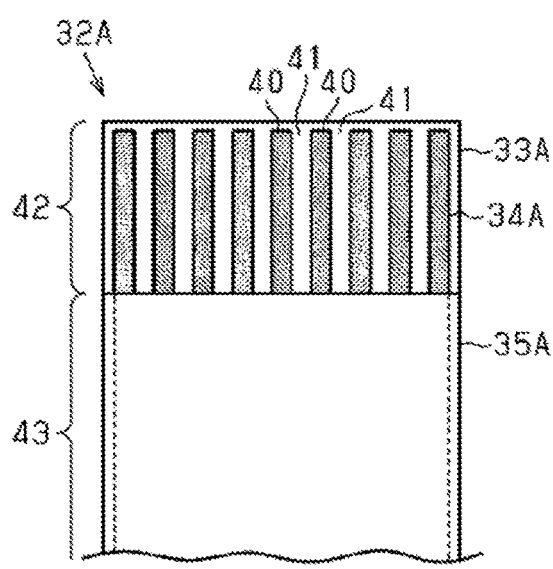
FIG. 5 shows an example of a pattern of a conductor of a wiring layer in the light control unit according to an embodiment.
Figure 6:
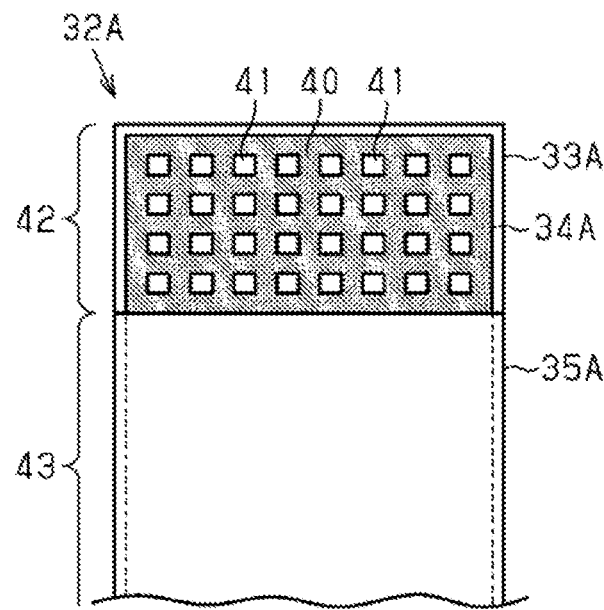
FIG. 6 shows an example of the pattern of the conductor of the wiring layer in the light control unit according to an embodiment.
Figure 7:
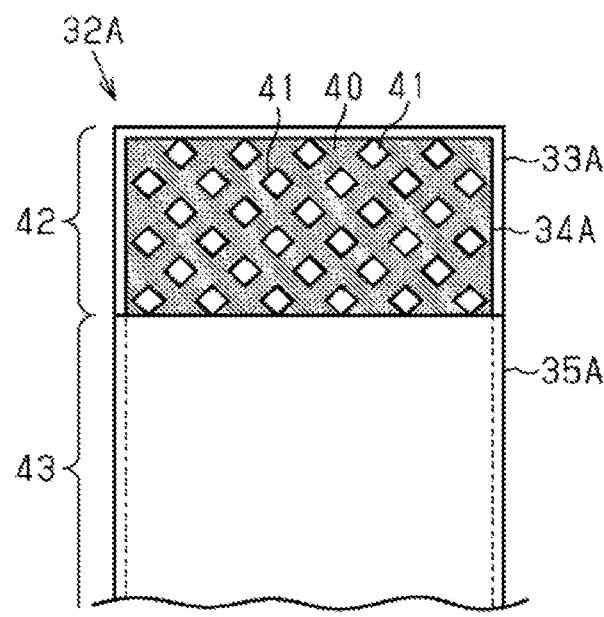
FIG. 7 shows an example of the pattern of the conductor of the wiring layer in the light control unit according to an embodiment.

With reference to FIGS. 5 to 7, a specific example of this conductive pattern will be described taking the first wiring member 32A as an example. In FIGS. 5 to 7, dotted regions are used to indicate the position of the pattern of the conductor of the wiring layer 34A.

As FIG. 5 shows, the pattern of the conductor may be striped. In this conductive pattern, conductive parts 40, where a conductor is located, each have a strip shape extending along the direction of extension of the first wiring member 32A, and the conductive parts 40 are aligned at a fixed interval along a width direction of the first wiring member 32A. The conductive pattern has openings 41A, each being a part between two conductive parts 40 adjacent to each other. Each of the openings 41 also has a strip shape extending along the direction of extension of the first wiring member 32A.

As FIG. 6 shows, the pattern of the conductor may have a mesh form. In this conductive pattern, a conductive part 40 includes a plurality of strips extending along the direction of extension of the first wiring member 32A and a plurality of strips extending along the width direction thereof, with these strips crossing each other to form a mesh pattern. Parts of the conductive pattern surrounded by the conductive part 40 are openings 41. The openings 41 form dots in the conductive pattern.

As FIG. 7 shows, the mesh pattern may be inclined relative to the direction of extension of the first wiring member 32A. In other words, in this conductive pattern, the conductive part 40 includes a plurality of first strips extending obliquely to the direction of extension of the first wiring member 32A and a plurality of second strips extending along a direction crossing the first strips to form a mesh form.

The conductive pattern is not limited to the example described above, but may be a pattern in which openings are defined between the conductors. The openings 41 may each be sandwiched by the conductive parts 40 along at least one direction. More specifically, the entire periphery of the openings 41 may be surrounded by the conductive parts 40, or be sandwiched by the conductive parts 40 in one direction and not in another direction.

In the opening 41, an adhesive layer underneath the wiring layer 34A or the insulating resin layer 33A is exposed from the wiring layer 34A. These exposed parts are joined to the first conductive adhesive layer 31A. In other words, the first conductive adhesive layer 31A is in contact with metal at the conductive part 40 and with a resin at the opening 41. The first conductive adhesive layer 31A is thus in partial contact with the resin at the joint part between the first wiring member 32A and the first conductive adhesive layer 31A, thereby strengthening the joint between the first wiring member 32A and the first conductive adhesive layer 31A, compared with the case where the first conductive adhesive layer 31A is in contact only with the metal, that is, the conductive part 40 spreads without any openings 41.

There is no limitation on the ratio of the openings 41, but preferably the openings 41 are evenly arranged. In other words, the area ratio of the openings 41 to the conductive part 40 is preferably constant per unit area in plan view of a region where the pattern of the conductor is located. Such a configuration prevents unevenness in joint strength in a joint part between the first wiring member 32A and the first conductive adhesive layer 31A.

In addition, if the first wiring member 32A and the first conductive adhesive layer 31A are joined by thermocompression bonding, evenly arranging the openings 41 prevents unevenness in the strength of a force applied to the first conductive adhesive layer 31A during thermocompression bonding. This in turn prevents unevenness in joint strength and in formation of a conductive path in the first conductive adhesive layer 31A. In particular, if the first conductive adhesive layer 31A is composed of an anisotropic conductive adhesive material, a preferable conductive path is formed along the conductive pattern in the first conductive adhesive layer 31A.

Generally, during connection of the first wiring member 32A and the first conductive adhesive layer 31A, pressure is applied to the part where the first wiring member 32A and the first conductive adhesive layer 31A are in contact with each other such that the position where the pressure is applied progresses along the direction of extension of the first wiring member 32A. Such a manufacturing method appropriately prevents unevenness in joint strength and in formation of a conductive path in the first conductive adhesive layer 31A if the conductive parts 40 are arranged at an equal interval in the width direction of the first wiring member 32A and have the same area ratio as the openings 41 in the direction of extension of the first wiring member 32A.

In the first wiring member 32A, it is preferred that a portion of the wiring layer 34A covered by the protective layer 35A is not patterned, that is, has no openings. In other words, the wiring layer 34A preferably has a patterned part 42 that constitutes the conductive pattern described above and an unpatterned part 43 that spreads without any openings 41. The patterned part 42 and the unpatterned part 43 are connected to each other and form a contiguous layer. In other words, the patterned part 42 and the unpatterned part 43 are electrically connected to each other. The unpatterned part 43 is located in a portion of the wiring layer 34A extending from an end thereof where the patterned part 42 is located, that is, in a portion of the first wiring member 32A not connected to the first conductive adhesive layer 31A.

An end of the first wiring member 32A on a side opposite to that joined to the first conductive adhesive layer 31A is connected to a driver circuit, whereby the first transparent electrode layer 23A and a power supply are electrically connected to each other. The driver circuit converts a voltage supplied from the power supply into a driving voltage and applies it to the first transparent electrode layer 23A through the first connection member 30A. It is sufficient that the wiring layer 34A serves as a single wire as a whole. Thus the load required for patterning can be alleviated and a resistance value in the wiring layer 34A can be inhibited from increasing if a part of the wiring layer 34A not connected to the first conductive adhesive layer 31A is unpatterned.

A portion of the unpatterned part 43 may be located in the part of the first wiring member 32A joined to the first conductive adhesive layer 31A. A portion of the patterned part 42 may be located in the part of the first wiring member 32A not connected to the first conductive adhesive layer 31A.

Although the conductive pattern has been described taking the first wiring member 32A of the first connection member 30A as an example, the configurations thereof described above can be applied to the second wiring member 32B of the second connection member 30B, and achieve a similar effect. The wiring layer 34A of the first wiring member 32A and the wiring layer 34B of the second wiring member 32B may have the same or different conductive pattern.

(Method of Manufacturing a Light Control Unit)

The light control unit 10 is manufactured, for example, by the following manufacturing method.

First, a multilayer sheet having the light control layer 21 and the electrode sheets 22A and 22B is formed. The multilayer sheet is then cut or stamped out into a shape corresponding to that of the transparent plate 50 to form a multilayer having the light control layer 21 and the electrode sheets 22A and 22B. After or before the multilayer is attached to the transparent plate 50 via an adhesive layer 60, wiring regions SA and SB are formed and the connection members 30A and 30B are connected thereto.

The first wiring region SA is formed by removing the second electrode sheet 22B and the light control layer 21 from a part of the multilayer described above. The second wiring region SB is formed by removing the first electrode sheet 22A and the light control layer 21 from a part of the multilayer described above. The removal of the parts in the electrode sheets 22A and 22B are performed by, for example, cutting off them from the remaining part. The removal of the part in the light control layer 21 is performed by, for example, wiping off it. The light control 20 is thus formed. With this manufacturing method, arranging the wiring regions SA and SB to include a corner of the light control sheet 20 allows the wiring regions SA and SB to be easily formed.

The connection members 30A and 30B are then arranged and joined on the exposed surface of the transparent electrode layers 23A and 23B, whereby the light control unit 10 is formed. A sealant may be formed as necessary on an outer circumference of the light control sheet 20 on the transparent plate 50. This manufacturing method aligns end faces of the light control layer 21 and the electrode sheets 22A and 22B in the thickness direction of the light control sheet 20 at an edge of the light control region Si in the light control sheet 20, that is, at an edge that constitutes an outer edge of the light control sheet 20 and at an edge contiguous to the wiring regions SA and SB.

The above manufacturing method improves the efficiency of manufacturing the light control sheet 20 as compared with a manufacturing method in which for each light control sheet 20, a sealing structure is formed between the electrode sheets 22A and 22B, followed by injecting liquid crystals between the electrode sheets 22A and 22B to form the light control layer 21. Furthermore, since the outer shape of the light control sheet 20 is formed by cutting out or stamping out a multilayer sheet, the manufacturing method facilitates formation of the light control sheet 20 having a shape corresponding to the shape of the transparent plate 50.

Since the wiring regions SA and SB are formed by partially removing the light control layer 21 and the electrode sheets 22A and 22B, the light control layer 21 and the electrode sheets 22A and 22B are easily formed as compared with a manufacturing method in which the light control layer 21 and the electrode sheets 22A and 22B are formed that have parts of the wiring regions SA and SB removed. It is also easy to adjust a size and arrangement of the wiring regions SA and SB.

(Operation)

An operation of the light control unit 10 will now be described. In the light control unit 10, the connection members 30A and 30B are structured such that the wiring layers 34A and 34B of the wiring members 32A and 32B are joined to surfaces of the conductive adhesive layers 31A and 31B, respectively. In such a structure, the part where the conductive adhesive layers 31A and 31B are joined to the wiring members 32A and 32B extends in a planar shape. A joint part between each member constituting the connection members 30A and 30B does not include a dot-like joint structure, such as a lead wire and solder joint. The reliability of connection at the connection members 30A and 30B thus increases. This consequently prevents poor joints at the connection members 30A and 30B even if an external force acts on the connection members 30A and 30B when, for example, the light control unit 10 is mounted on the transparent plate 50 or when the light control unit 10 is moved along with the transparent plate 50, such as when the light control unit 10 is used on a window or the like.

In particular, the wiring layers 34A and 34B have a conductive pattern in a part joined to the adhesive layers 31A and 31B, which enables a more reliable joint at the connection members 30A and 30B, as described above.

In the present embodiment, the transparent electrode layers 23A and 23B, to which a signal from the driver circuit is supplied, are unpatterned, that is, have no openings, in a joint part with the connection members 30A and 30B. Thus, the conductive pattern of the wiring layers 34A and 34B does not serve as mutually insulated wiring for supplying separate signals to a plurality of elements. In the light control unit 10, the wiring layers 34A and 34B do not need to be patterned in terms of wiring for supplying signals to the transparent electrode layers 23A and 23B. In the present embodiment, forming a conductive pattern on the wiring layers 34A and 34B in the light control unit 10 increases the joint strength between the wiring members 32A and 32B and the conductive adhesive layers 31A and 31B due to the presence of openings between conductors.

In addition, affixing copper tape on a silver paste in a conventional light control unit tends to result in poor joints due to the joint strength of the copper tape decreasing in a cool, hot, or humid environment. By contrast, if any of an anisotropic conductive film, an anisotropic conductive paste, an isotropic conductive film, and an isotropic conductive paste is used as the conductive adhesive layers 31A and 31B, and the wiring layers 34A and 34B are joined to the conductive adhesive layers 31A and 31B as in the present embodiment, the connection members 30A and 30B have sufficient joint reliability in a cool, hot, or humid environment.

The connection members 30A and 30B of the present embodiment are thinner at a part connected to the wiring regions SA and SB than conventional connection members including lead wire and solder. This readily makes it possible to make the first connection member 30A thinner than the total thickness of the light control layer 21 and the second electrode sheet 22B, and also to make the second connection member 30B thinner than the total thickness of the light control layer 21 and the first electrode sheet 22A, as described above. This in turn makes it possible to prevent the connection members 30A and 30B from protruding and suffering an impact upon coming into contact with other members, and also the second electrode sheet 22B from distorting due to a bump of the second wiring region SB in the light control sheet 20.

As described above, the light control unit 10 of the present embodiment achieves the following effects.

(1) The connection members 30A and 30B consist of the conductive adhesive layers 31A and 31B and the wiring members 32A and 32B, respectively. A joint part between the conductive adhesive layers 31A and 31B and the wiring members 32A and 32B extends in a planar shape. This improves joint reliability at the connection members 30A and 30B, compared with the case where the connection members 30A and 30B include a dot-like joint structure with solder and lead wire.

(2) The wiring layers 34A and 34B of the wiring members 32A and 32B have a conductive patterned end, and are joined to the conductive adhesive layers 31A and 31B at their respective ends. Accordingly, the conductive adhesive layers 31A and 31B are joined to the wiring members 32A and 32B so as to be in partial contact with a resin part between metal parts. This improves joint strength between the conductive adhesive layers 31A and 31B and the wiring members 32A and 32B, which in turn improves joint reliability at the connection members 30A and 30B, compared with the case where the conductive adhesive layers 31A and 31B are joined to a uniform metal surface.

(3) If an area ratio of the conductive part 40 to the opening 41 is constant in unit area in plan view of the region of the wiring members 32A and 32B where the conductive pattern is formed, uneven joint strength is prevented in a joint part between the conductive adhesive layers 31A and 31B and the wiring members 32A and 32B. For example, in the case of the conductive pattern having a striped or mesh form, a desired area ratio between the conductive part 40 and the opening 41 is easily provided in unit area described above.

(4) The first connection member 30A has a thickness less than the total thickness of the light control layer 21 and the second electrode sheet 22B. The second connection member 30B has a thickness less than the total thickness of the light control layer 21 and the first electrode sheet 22A. Such a configuration makes the light control unit 10 thinner in the wiring regions SA and SB than the light control sheet 20 in the light control region Si. This prevents the connection members 30A and 30B from protruding and suffering an impact upon coming into contact with other components, and also the second electrode sheet 22B from undergoing distortion due to the second wiring region 22B in the light control sheet 20 being raised.

(5) The wiring layers 34A and 34B in the wiring members 32A and 32B include an unpatterned part 43, which has no opening 41 and extends from the end where the conductive pattern is located. Unlike the entire wiring layers 34A and 34B being patterned, such a configuration described above reduces the load required for patterning and inhibits a resistance value from increasing in the wiring layers 34A and 34B.

(6) In plan view of the light control sheet 20, the first wiring region SA and the second wiring region SB are aligned along a side of the light control sheet 20, and the inter-terminal region Se, which is a part of the light control region Si, is located between the first wiring region SA and the second wiring region SB. In such a configuration, the connection members 30A and 30B are disposed together along one side of the light control sheet 20, allowing a large main region Sm to be easily available. In addition, the configuration prevents expansion of a path from the connection members 30A and 30B to the driver circuit or of a region required to arrange each connection member outside the light control sheet 20. Further, according to the configuration described above, after forming, from a multilayer sheet, a multilayer laminate serving as the light control sheet 20, the wiring regions SA and SB are formed by removing the light control layer 21 and the electrode sheets 22A and 22B, thereby allowing the light control sheet 20 to be easily produced.

(7) The first connection member 30A and the second connection member 30B can be separately attached to the wiring regions SA and SB, respectively, because the first connection member 30A and the second connection member 30B are separate from each other outside the light control sheet 20. It is therefore easy to assemble the light control unit 10, as compared with the case where the first connection member 30A and the second connection member 30B are connected to each other.

(8) The wiring members 32A and 32B are flexible printed circuit boards. The conductive adhesive layers 31A and 31B are any of an anisotropic conductive film, an anisotropic conductive paste, an isotropic conductive film, and an isotropic conductive paste. This configuration provides wiring members 32A and 32B suitable for the connection members 30A and 30B. The configuration also achieves a sufficiently reliable joint at the connection members 30A and 30B in a cold, hot, or humid environment.

<Modifications>

The above embodiment can be implemented with modifications as described below. Note that each of the following modifications can be implemented in combination.

(First Modification)

Figure 8:
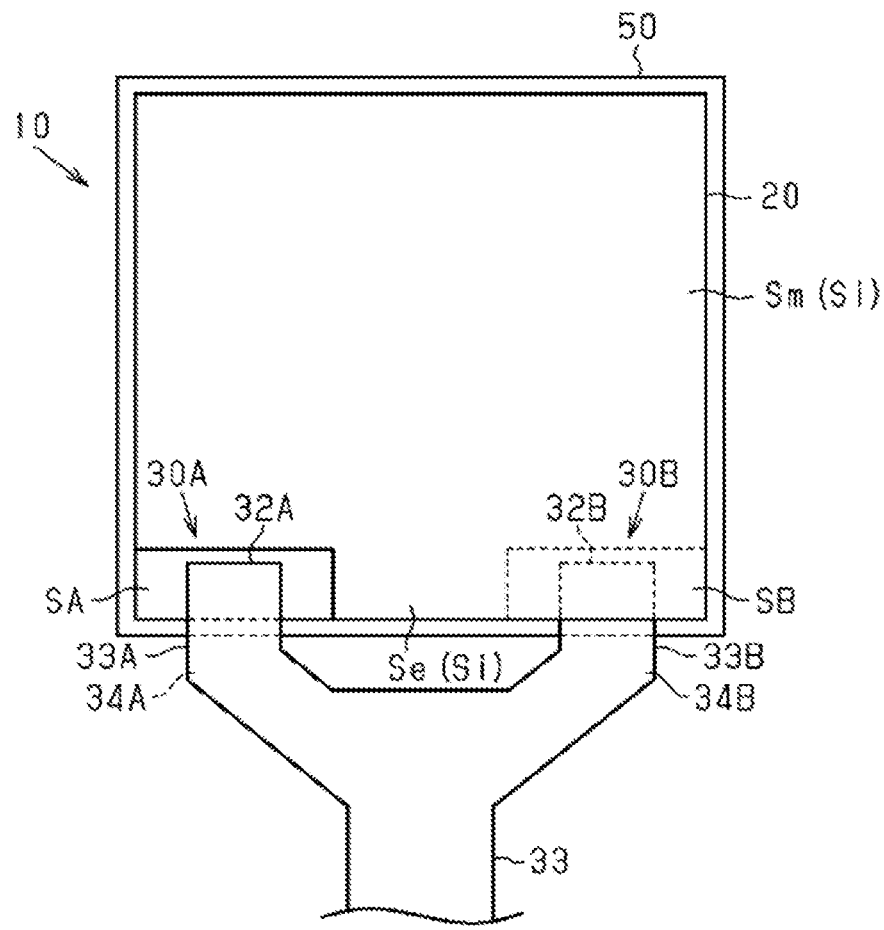
FIG. 8 shows a planar structure of a light control unit according to a first modification of the light control unit.

As shown in FIG. 8, the first wiring member 32A and the second wiring member 32B may be connected to each other outside the light control sheet 20. In more detail, an insulating resin layer 33A of the first wiring member 32A and an insulating resin layer 33B of the second wiring member 32B constitute a single substrate 33, which bifurcates near the light control sheet 20. The wiring layer 34A is located on one side of the substrate 33. The substrate 33 and the wiring layer 34A constitute the first wiring member 32A. In addition, the wiring layer 34B is located on the other side of the substrate 33. The substrate 33 and the wiring layer 34B constitute the second wiring member 32B. That is, the above embodiment uses a flexible printed circuit board having a metal thin film disposed on both sides of the substrate 33, with the metal film serving as a wiring layer.

The first modification reduces an area occupied by the connection members 30A and 30B outside the light control sheet 20.

(Second Modification)

In plan view of the light control sheet 20, the first wiring region SA and the second wiring region SB may be disposed along different sides of the light control sheet 20. In other words, the first connection member 30A and the second connection member 30B may not be aligned along one side of the light control sheet 20.

The configuration of the second modification allows a higher degree of freedom in arranging the first connection member 30A and the second connection member 30B, and also enables adjustment of the positions of the first connection member 30A and the second connection member 30B depending on the size, location of installation, etc. of the light control sheet 20.

(Third Modification)

The light control sheet 20 may have a plurality of first wiring regions SA, to each of which a first connection member 30A may be connected. In other words, the light control unit 10 may have a plurality of first connection members 30A. The plurality of first connection members 30A may be controlled at the same potential, and also be separately connected to the driver circuit. Alternatively, the plurality of first connection members 30A may be connected to each other outside the light control sheet 20. In other words, the plurality of first connection members 30A may constitute a connection member having a single terminal to which a signal is applied from the driver circuit and a plurality of terminals for outputting the signal to the light control sheet 20.

The configuration described above reduces the load on the driver circuit when controlling the first transparent electrode layer 23A at a predetermined potential.

Similarly, the light control sheet 20 may have a plurality of second wiring regions SB, and the light control unit 10 may have a plurality of second connection members 30B, each of which may be connected to a respective one of the second wiring regions SB. The plurality of second connection members 30B may be separately connected to the driver circuit and be connected to each other outside the light control sheet 20.

The configuration described above reduces the load on the driver circuit when controlling the second transparent electrode layer 23B at a predetermined potential. The configuration of the third modification is particularly effective when the light control region Si is large.

(Fourth Modification)

Figure 9:
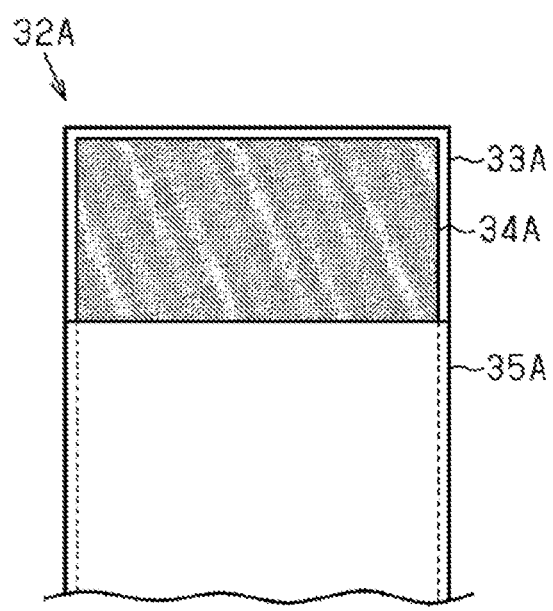
FIG. 9 shows a planar structure of a wiring member according to a fourth modification of the light control unit.

As shown in FIG. 9, the wiring layer 34A may not be patterned in a part of the first wiring member 32A joined to the first conductive adhesive layer 31A. In other words, the wiring layer 34A may extend without any openings 41, in a part joined to the first conductive adhesive layer 31A. Similarly, the wiring layer 34B may not be patterned in a part of the second wiring member 32B joined to the second conductive adhesive layer 31B.

The configuration of the fourth modification also has a planar joint part between the conductive adhesive layers 31A and 31B and the wiring members 32A and 32B. This improves joint reliability at the connection members 30A and 30B, compared with the case where the connection members 30A and 30B include a dot-like joint structure with solder and lead wire. That is, the effect (1) described above can be obtained.

(Fifth Modification)

Figure 10:
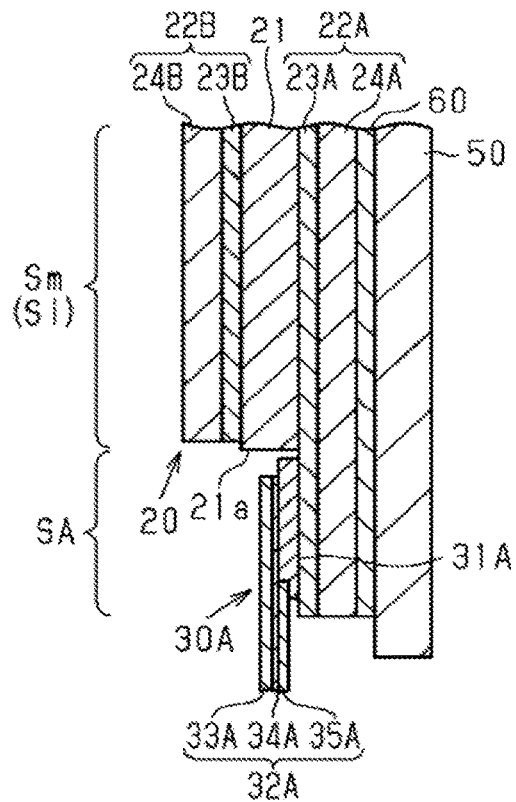
FIG. 10 shows a cross-sectional structure of a light control unit according to a fifth modification of the light control unit.
Figure 11:
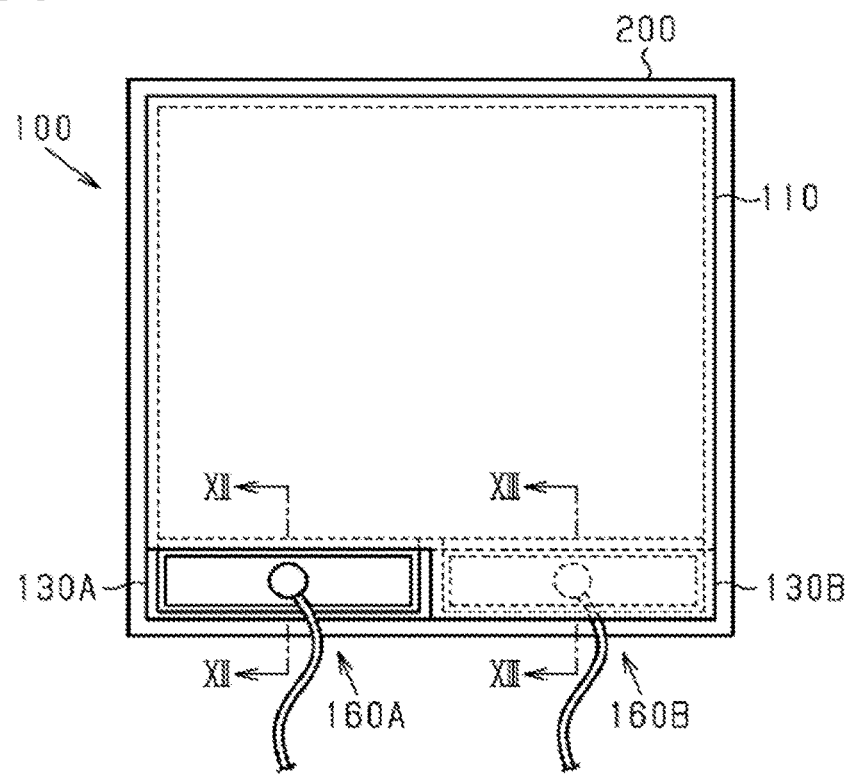
FIG. 11 shows a planar structure of a conventional light control unit.
Figure 12:
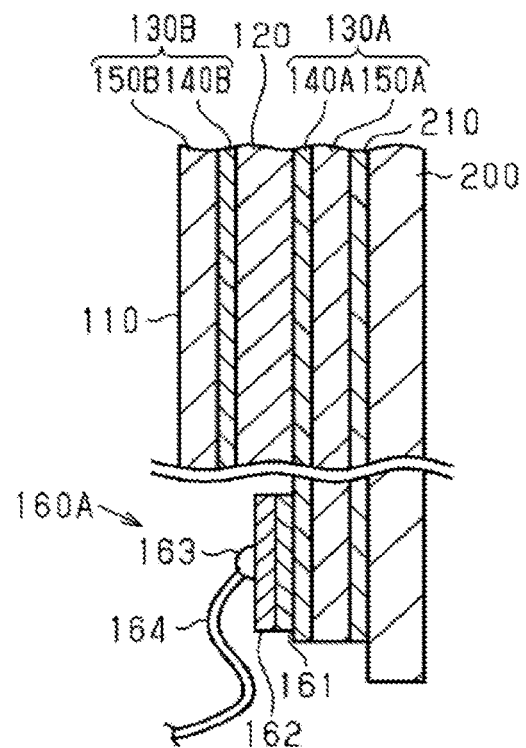
FIG. 12 shows a cross-sectional structure taken along the line XII-XII in FIG. 11.
Figure 13:
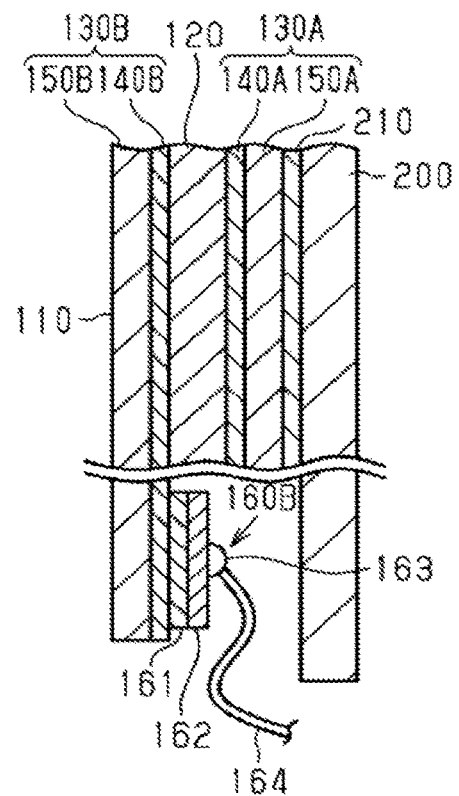
FIG. 13 shows a cross-sectional structure taken along the line XIII-XIII in FIG. 11.

The first connection member 30A may not include the first sealing member 36A. Similarly, the second connection member 30B may not include the second sealing member 36B. In a configuration without the sealing members 36A and 36B, an edge 21a of the light control layer 21 may protrude from an edge of the second electrode sheet 22B at the edge of the light control region Si contiguous to the first wiring region SA, as shown in FIG. 10. Similarly, an edge of the light control layer 21 may protrude from an edge of the first electrode sheet 22A at the edge of the light control region Si contiguous to the second wiring region SB. According to such a configuration, the protrusion of the light control layer 21 makes it hard for the first transparent electrode layer 23A and the second transparent electrode layer 23B to come into contact with each other even if the light control sheet 20 is crushed at the end of the light control region Si, thereby preventing a short circuit.

Each end face of the electrode sheets 22A and 22B may not be aligned with a corresponding end face of the light control layer 21 at the edges of the light control region Si, regardless of whether the sealing members 36A and 36B are present.

(Sixth Modification)

Flexible flat cables (FFC) may be used as the wiring members 32A and 32B. A flexible flat cable is structured such that a plurality of conductor strips arranged in parallel are sandwiched by two insulating resin films. At an end of the flexible flat cable, the conductor strips are exposed from the insulating resin films, and these exposed parts are joined to the conductive adhesive layers 31A and 31B. The plurality of conductor strips correspond to wiring layers, the array pattern of the plurality of conductor strips corresponds to a pattern of a conductor, and the insulating resin film corresponds to an insulating resin layer.

If a flexible printed circuit board is used as the wiring members 32A and 32B, a conductive pattern is formed by etching a metal thin film, which allows a higher degree of freedom in pattern shape and makes it possible to form a fine pattern. If a flexible flat cable is used as the wiring members 32A and 32B, the wiring members 32A and 32B can be provided at a low cost. Flexible flat cables only allow a limited degree of freedom in pattern shape but still allow adjustment of the ratio of a conductor to an opening through adjustment of the width and array interval of conductor strips, thereby improving the joint strength.

(Other Modifications)

In the embodiment described above, the wiring members 32A and 32B include at least the wiring layers 34A and 34B and the insulating resin layers 33A and 33B. The wiring members 32A and 32B may be, for example, a flexible printed circuit board having a metal thin film on a surface of the insulating resin layers 33A and 33B facing away from the surface joined to the conductive adhesive layers 31A and 31B, respectively. In addition, the wiring layers 34A and 34B are metal layers and may be composed of a plurality of layers including a plating layer, etc. The insulating resin layers 33A and 33B are resin layers and may be composed of a plurality of layers. Furthermore, the conductive adhesive layers 31A and 31B are layers that are conductive and adhesive, and may be composed of a plurality of layers.

The light control sheet 20 may include an additional layer as well as the light control layer 21 and the electrode sheets 22A and 22B. Examples of the additional layers include a layer for protecting the light control layer 21 and the transparent electrode layers 23A and 23B, such as a layer having a UV barrier function; a layer contributing to control optical transparency of the light control sheet 20; and a layer improving characteristics such as strength or heat resistance of the light control sheet 20.

Furthermore, the light control sheet 20 may include a pair of orientation layers that are located between the light control layer 21 and the electrode sheets 22A and 22B and that sandwich the light control layer 21. The orientation layer is a layer that controls orientation of the liquid crystal molecules contained in the light control layer 21. When no driving voltage is applied, the orientation layer orients the liquid crystal molecules in a normal direction thereof. In the configuration including the orientation layer, when no driving voltage is applied across the transparent electrode layers 23A and 23B, the light control region Si is transparent, and when a driving voltage is applied across the transparent electrode layers 23A and 23B, the light control region Si is opaque.

If the light control sheet 20 further includes a layer other than the light control layer 21 and electrode sheets 22A and 22B, in the first wiring region SA, a surface of the first transparent electrode layer 23A may be exposed from the other layers and the first connection member 30A may be connected to this surface, while in the second wiring region SB, a surface of the second transparent electrode layer 23B may be exposed from the other layers and the second connection member 30B may be connected to this surface.

The light control layer 21 may include a dye that has a predetermined color and does not hinder movement of the liquid crystal molecules according to a magnitude of the voltage applied to the light control layer 21. Such a configuration provides a light control sheet 20 having a predetermined color.

The wiring regions SA and SB may be disposed at a location that does not include a corner of the light control sheet 20. If the light control unit is formed by the manufacturing method of the embodiment described above, the entire region other than the wiring regions SA and SB in the light control sheet 20 serves as the light control region Si. The light control sheet 20 may not be rectangular.

A surface of the transparent plate 50 to which the light control sheet 20 is attached may be flat or curved. Using a flexible printed circuit board or a flexible flat cable as the wiring members 32A and 32B keeps the wiring members 32A and 32B highly flexible while improving joint reliability at the connection members 30A and 30B. The light control unit 10 thus readily fits with a curved surface, and is therefore suitable for being mounted on a curved surface.

Either of the first electrode sheet 22A or the second electrode sheet 22B may be attached to the transparent plate 50. The light control sheet 20 may be sandwiched between two transparent plates 50.

The present application addresses the following. During, for example, transportation of the light control unit 100 or attachment of the light control unit 100 to the transparent sheet 200, the lead wire 164 moves against the light control sheet 110 or a shock caused by collision of the solder ball 163 with the transparent sheet 200 is applied to the connection member 160B. In the connection members 160A and 160B, the conductive tape 162 and the lead wire 164 are connected to each other with the solder ball 163 to form a dot-like joint structure, so that the joint can hardly be said to be highly durable against the movement or shock described above.

An aspect of the present invention is to provide a light control unit that enables a more reliable joint at a connection member connected to a transparent electrode layer.

A light control unit includes a light control sheet including a light control layer containing a liquid crystal composition, a first transparent electrode layer, and a second transparent electrode layer; and a first connection member configured to connect the first transparent electrode layer and a power supply. The light control layer is sandwiched by the first transparent electrode layer and the second transparent electrode layer. In plan view of the light control sheet, the first transparent electrode layer includes a first region contiguous to a light control region where the light control layer is located. The first connection member includes a first conductive adhesive layer joined to the first region and a first wiring member joined to the first conductive adhesive layer. The first wiring member includes a wiring layer and an insulating resin layer supporting the wiring layer. The wiring layer has a conductive patterned end, and is in contact with the first conductive adhesive layer at the end.

The configuration described above has a planar joint part between between the first conductive adhesive layer and the first wiring member. This achieves a more reliable joint at the first connection member, compared with the case where the first connection member includes a dot-like joint structure formed with solder and lead wire. In addition, the first wiring member has a conductive patterned end, and is joined to the first conductive adhesive layer at the end. Accordingly, the first conductive adhesive layer is joined to the first wiring member so as to be in contact with a resin part between metal parts. This improves joint strength between the first conductive adhesive layer and the first wiring member, compared with the case where the first conductive adhesive layer is joined to a uniform metal surface, thus further increasing the reliability of joint at the first connection member.

In the light control unit, in plan view of a region where the conductive patterned end is located, an area ratio per unit area between the conductive patterned end and an opening defined by the conductive patterned end may be constant.

The configuration described above prevents unevenness in joint strength in a part where the first conductive adhesive layer is joined to the first wiring member.

In the light control unit described above, the conductive patterned end may have a striped or mesh form.

The configuration described above makes it easy for the area ratio per unit area between the conductive patterned end and the opening to be a desired value.

In the light control unit described above, the light control sheet may include a second transparent support layer supporting the second transparent electrode layer, and the first connection member may have a thickness less than the total thickness of the light control layer, the second transparent electrode layer, and the second transparent support layer.

With the configuration described above, the thickness of the light control unit in a part where the first connection member is located is less than the thickness of the light control sheet in the light control region. This prevents the first connection member from protruding from a surface of the light control sheet or the first region from being raised relative to the light control region.

In the light control unit described above, the wiring layer may be composed of a metal thin film and include an unpatterned part having no opening and extending from the end.

Unlike the entire wiring layer being patterned, the configuration described above reduces the amount of load required to form a pattern and prevents a resistance value from increasing in the wiring layer.

The light control unit described above includes a second connection member configured to connect the second transparent electrode layer and the power supply. The second transparent electrode layer includes a second region contiguous to the light control region in plan view of the light control sheet. The second connection member includes a second conductive adhesive layer joined to the second region and a second wiring member joined to the second conductive adhesive layer. With this light control unit, in plan view of the light control sheet, the first region and the second region may be aligned along one side of the light control sheet and part of the light control region may be located therebetween.

The configuration described above readily provides a large light control area, and prevents expansion of a path from each connection member to a driver circuit or of a region required to arrange each connection member outside the light control sheet. In addition, the first region is formed by removing, for example, the light control layer and the transparent electrode layer from a multilayered laminate including the light control layer and each transparent electrode layer, thus facilitating manufacture of the light control sheet.

With the light control unit described above, in plan view of the light control sheet, the first connection member and the second connection member may extend toward the outside of the light control sheet, and the first wiring member and the second wiring member may be separate from each other outside the light control sheet.

The configuration described above allows the first connection member and the second connection member to be attached to the light control sheet as separate members. This facilitates assembly of the light control unit, as compared with the case where the first connection member and the second connection member are connected to each other.

With the light control unit described above, in plan view of the light control sheet, the first connection member and the second connection member may extend toward the outside of the light control sheet and be connected to each other outside the light control sheet.

This configuration reduces an area occupied by the first connection member and the second connection member outside the light control sheet.

The light control unit described above includes a second connection member configured to connect the second transparent electrode layer to the power supply. The second transparent electrode layer includes a second region contiguous to the light control region in plan view of the light control sheet. The second connection member includes a second conductive adhesive layer joined to the second region and a second wiring member joined to the second conductive adhesive layer. With this light control unit, in plan view of the light control sheet, the first region and the second region may be disposed along different sides of the light control sheet.

The configuration described above allows a higher degree of freedom in arranging the first connection member and the second connection member, and also facilitates adjustment of positions of the first connection member and the second connection member according to the size, location of installation, etc. of the light control sheet.

In the light control unit described above, the first transparent electrode layer may include a plurality of the first regions, and the light control unit may include a plurality of the first connection members, each of which may be connected to any one of the plurality of first regions for each of the first connection members.

The configuration described above reduces the amount of load required for a driver circuit to control the first transparent electrode layer at a predetermined potential.

In the light control unit described above, the first wiring member may be a flexible printed circuit board, and the first conductive adhesive layer may be composed of any of an anisotropic conductive film, an anisotropic conductive paste, an isotropic conductive film, and an isotropic conductive paste.

The configuration described above provides a first wiring member suitable for the first connection member. The configuration also offers a sufficiently reliable joint at the first connection member in a cold, hot, or humid environment.

The present invention in an aspect offers a more reliable joint at a connection member of a light control unit.

REFERENCE SIGNS LIST

SA, SB: Wiring region
Si: Light control region
Sm: Main region
Se: Inter-terminal region
10, 100: Light control unit
20, 110: Light control sheet
21, 120: Light control layer
22A, 22B, 130A, 130B: Electrode sheet
23A, 23B, 140A, 140B: Transparent electrode layer
24A, 24B, 150A, 150B: Transparent support layer
30A, 30B, 160A, 160B: Connection member
31A, 31B, 161: Conductive adhesive layer
32A, 32B: Wiring member
33A, 33B: Insulating resin layer
34A, 34B: Wiring layer
35A, 35B: Protective layer
36A, 36B: Sealing member
50: Transparent plate
40: Conductive part
41: Opening
42: Patterned part
43: Unpatterned part
60: Adhesive layer
162: Conductive tape
163: Solder ball
164: Lead wire Obviously, numerous modifications and variations of the present invention are possible in light of the above teachings. It is therefore to be understood that within the scope of the appended claims, the invention may be practiced otherwise than as specifically described herein.

What is claimed is:

1. A light control unit, comprising:
a light control sheet including a first transparent electrode layer, a second transparent electrode layer, and a light control layer formed between the first and second transparent electrode layers and comprising a liquid crystal composition;
a first conductive adhesive layer formed on the first transparent electrode layer of the light control sheet such that the first conductive adhesive layer is formed in a first region of the light control sheet and that the first region is contiguous to a light control region of the light control sheet; and
a first connection member configured to connect the first transparent electrode layer and a power supply and comprising a first wiring member connected to the first conductive adhesive layer formed on the first transparent electrode layer of the light control sheet in the first region of the light control sheet,
wherein the light control sheet is formed such that each of the first and second transparent electrode layers is an unpatterned transparent electrode layer, the light control sheet is formed such that the light control layer is formed in the light control region, the first wiring member of the first connection member includes a wiring layer comprising a metal thin film and an insulating resin layer supporting the metal thin film of the wiring layer, and the metal thin film of the wiring layer has a conductive patterned end portion configured to make contact with the first conductive adhesive layer and an unpatterned portion having no opening and extending from the conductive patterned end portion such that the first conductive adhesive layer is in partial contact with the insulating resin layer in the conductive patterned end portion.

2. The light control unit according to claim 1, wherein the metal thin film of the wiring layer has the conductive patterned end portion and an opening portion defined by the conductive patterned end portion such that a ratio between an area of the conductive patterned end portion and an area of the opening portion is constant per unit area in a plan view of a region where the conductive patterned end portion is formed.

3. The light control unit according to claim 2, wherein the conductive patterned end portion has a striped or mesh form.

4. The light control unit according to claim 2, wherein the light control sheet further includes a second transparent support layer supporting the second transparent electrode layer, and the first connection member has a thickness less than a total thickness of the light control layer, the second transparent electrode layer, and the second transparent support layer.

5. The light control unit according to claim 2, wherein the first wiring member includes a protective layer formed on the unpatterned portion of the wiring layer such that the protective layer is covering the unpatterned portion and exposing the conductive patterned end portion.

6. The light control unit according to claim 2, further comprising:
a second conductive adhesive layer formed on the second transparent electrode layer of the light control sheet such that the second conductive adhesive layer is formed in a second region of the light control sheet and that the second region is contiguous to the light control region; and
a second connection member configured to connect the second transparent electrode layer and the power supply and comprising a second wiring member connected to the second conductive adhesive layer formed on the second transparent electrode layer of the light control sheet in the second region of the light control sheet,
wherein the light control sheet is formed such that the first region and the second region are aligned along one side of the light control sheet and that a portion of the light control region formed between the first region and the second region.

7. The light control unit according to claim 6, wherein the first connection member and the second connection member extend outside of the light control sheet in the plan view of the light control sheet, and the first wiring member and the second wiring member are separate from each other outside the light control sheet.

8. The light control unit according to claim 6, wherein the first connection member and the second connection member extend outside of the light control sheet in the plan view of the light control sheet, and the first wiring member and the second wiring member are connected to each other outside the light control sheet.

9. The light control unit according to claim 2, further comprising:
   a second conductive adhesive layer formed on the second transparent electrode layer of the light control sheet such that the second conductive adhesive layer is formed in a second region of the light control sheet and that the second region is contiguous to the light control region; and
   a second connection member configured to connect the second transparent electrode layer and the power supply and comprising a second wiring member connected to the second conductive adhesive layer formed on the second transparent electrode layer of the light control sheet in the second region of the light control sheet,
   wherein the light control sheet is formed such that the first region and the second region are positioned along different sides of the light control sheet.

10. The light control unit according to claim 2, wherein the first region comprises a plurality of first regions, the first transparent electrode layer includes the first regions, and the first connection member comprises a plurality of first connection members each of which is connected to one of the first regions of the first transparent electrode layer.

11. The light control unit according to claim 2, wherein the first wiring member is a flexible printed circuit board, and the first conductive adhesive layer comprises one of an anisotropic conductive film, an anisotropic conductive paste, an isotropic conductive film, and an isotropic conductive paste.

12. The light control unit according to claim 1, wherein the conductive patterned end portion has a striped or mesh form.

13. The light control unit according to claim 1, wherein the light control sheet further includes a second transparent support layer supporting the second transparent electrode layer, and the first connection member has a thickness less than a total thickness of the light control layer, the second transparent electrode layer, and the second transparent support layer.

14. The light control unit according to claim 1, wherein the first wiring member includes a protective layer formed on the unpatterned portion of the metal thin film of the wiring layer such that the protective layer is covering the unpatterned portion and exposing the conductive patterned end portion.

15. The light control unit according to claim 1, further comprising:
   a second conductive adhesive layer formed on the second transparent electrode layer of the light control sheet such that the second conductive adhesive layer is formed in a second region of the light control sheet and that the second region is contiguous to the light control region; and
   a second connection member configured to connect the second transparent electrode layer and the power supply and comprising a second wiring member connected to the second conductive adhesive layer formed on the second transparent electrode layer of the light control sheet in the second region of the light control sheet,
   wherein the light control sheet is formed such that the first region and the second region are aligned along one side of the light control sheet and that a portion of the light control region is formed between the first region and the second region.

16. The light control unit according to claim 15, wherein the first connection member and the second connection member extend outside of the light control sheet in the plan view of the light control sheet, and the first wiring member and the second wiring member are separate from each other outside the light control sheet.

17. The light control unit according to claim 15, wherein the first connection member and the second connection member extend outside of the light control sheet in the plan view of the light control sheet, and the first wiring member and the second wiring member are connected to each other outside the light control sheet.

18. The light control unit according to claim 1, further comprising:
   a second conductive adhesive layer formed on the second transparent electrode layer of the light control sheet such that the second conductive adhesive layer is formed in a second region of the light control sheet and that the second region is contiguous to the light control region; and
   a second connection member configured to connect the second transparent electrode layer and the power supply and comprising a second wiring member connected to the second conductive adhesive layer formed on the second transparent electrode layer of the light control sheet in the second region of the light control sheet,
   wherein the light control sheet is formed such that the first region and the second region are positioned along different sides of the light control sheet.

19. The light control unit according to claim 1, wherein the first region comprises a plurality of first regions, the first transparent electrode layer includes the first regions, and the first connection member comprises a plurality of first connection members each of which is connected to one of the first regions of the first transparent electrode layer.

20. The light control unit according to claim 1, wherein the first wiring member is a flexible printed circuit board, and the first conductive adhesive layer comprises one of an anisotropic conductive film, an anisotropic conductive paste, an isotropic conductive film, and an isotropic conductive paste.

* * * * *